United States Patent [19]

Fuller et al.

[11] Patent Number: 4,883,054
[45] Date of Patent: Nov. 28, 1989

[54] OPTICAL FIBER BREAK DETECTOR

[75] Inventors: Terry A. Fuller, Highland Park; John G. Kwasegroch, Algonquin, both of Ill.

[73] Assignee: Fuller Research Corporation, Vernon Hills, Ill.

[21] Appl. No.: 130,828

[22] Filed: Dec. 9, 1987

[51] Int. Cl.[4] .................................................. A61B 17/00
[52] U.S. Cl. .................................. 128/303.1; 128/395; 356/73.1
[58] Field of Search ........................... 128/303.1, 395; 356/73.1, 237; 250/227

[56] References Cited

U.S. PATENT DOCUMENTS

| 3,884,585 | 5/1975 | Lebduska | 356/73.1 X |
| 4,174,149 | 11/1979 | Rupp | 350/96.33 |
| 4,311,142 | 1/1982 | Machida | 128/303.1 |
| 4,385,832 | 5/1983 | Doi et al. | 356/73.1 |
| 4,450,434 | 5/1984 | Nielsen et al. | 356/73.1 X |
| 4,482,890 | 11/1984 | Forbes et al. | 340/556 |
| 4,525,702 | 6/1985 | Kitagawa et al. | 340/556 |
| 4,543,477 | 9/1985 | Doi et al. | 128/303.1 X |
| 4,659,215 | 4/1987 | Sumida et al. | 356/73.1 |
| 4,708,476 | 11/1987 | So et al. | 356/73.1 |
| 4,716,288 | 12/1987 | Doi | 356/73.1 X |
| 4,726,676 | 2/1988 | Maslaney et al. | 356/73.1 |

Primary Examiner—Kyle L. Howell
Assistant Examiner—Angela D. Sykes
Attorney, Agent, or Firm—Seidel, Gonda, Lavorgna & Monaco

[57] ABSTRACT

An apparatus for detecting a break in an optical fiber adapted for carrying optical energy such laser energy. The optical fiber has a core, a cladding concentric with and surrounding the core and a sheath concentric with and surrounding the cladding. A detector is located within the sheath and has a portion thereof contiguous with the cladding. The detector is adapted to detect both a break in the portion contiguous to cladding as a result of a break in the fiber and a change in transmission of optical energy resulting from a break in the fiber without a concomitant break in the contiguous portion, and to provide a signal indicative of a break in the fiber.

15 Claims, 2 Drawing Sheets

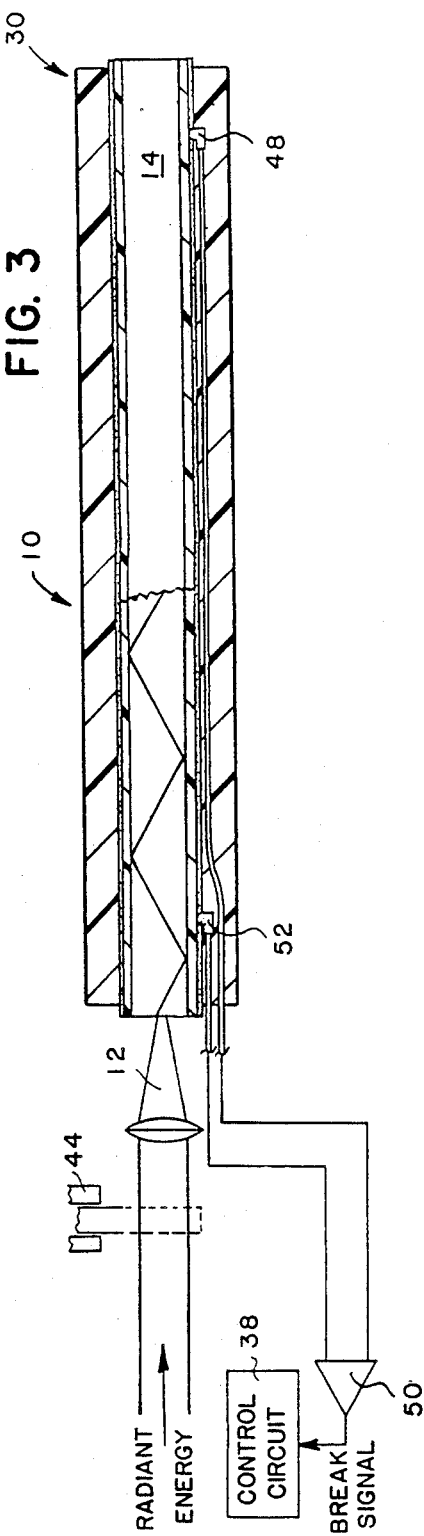
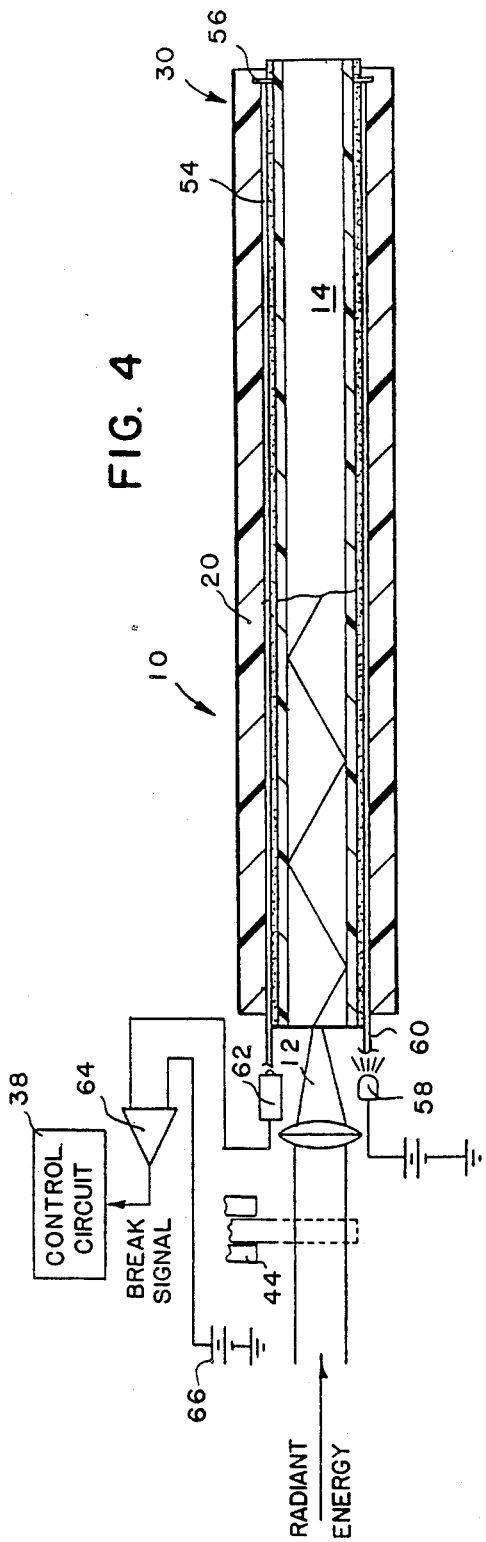

OPTICAL FIBER BREAK DETECTOR

This invention relates to apparatus for detecting a break or discontinuity in an optical fiber of the type used for laser transmission.

Lasers, particularly high power near infrared and infrared lasers, are increasingly used in surgical procedures. It is of extreme importance in carrying out those procedures that there be no leakage of laser radiation from the optical fiber carrying the laser energy to a point of use. Such leakage can occur, for example, as a result of a break in the optical fiber. To prevent injury to both patient and surgeon, and to prevent damage to expensive instrumentation, it is imperative that such leaks be immediately detected. Upon detection of a leak, a visible or audible indication can be given to the surgeon or, alternatively, laser input to the fiber can be terminated automatically upon detecting a break.

It is an object of this invention to provide an apparatus for achieving these objectives which is both reliable and simple in operation.

Prior attempts have been made to provide such an apparatus, but these attempts have proven to be unworkable in practice. U.S. Pat. No. 4,311,142 to Machida is an example of such an attempt.

Machida discloses a device for electrically detecting leakage of laser beam due to snapping of the laser guide using a wire or a conductor and the snapping of the wire by melting or by variations of the wire's resistance due to raised temperature or by short-circuit of the wire. Machida requires several events to take place in order to work. First, the "snapping" of a quartz glass guide; second, the transmission of the laser beam down the guide; third, ". . .the impingement of a laser beam. . . ."[on the wire ]"; and fourth, ". . .alter[ing] the current flowing therethrough" or "melt[ing the wire] upon being hit by leaking laser beams to form an interruption in said electrical path". Thus there appear to be three basic mechanisms involved: (1) melting the wire or conductor and sensing a resulting change in the conductivity caused by the impinging laser beam; (2) melting the dielectric between two conductors and sensing the resultant short circuit; and (3) heating a temperature sensitive wire and sensing changes in current.

Machida has several limitations. Consider the first mechanism, melting the wire. A wire or conductor must be heated to at least its melting point in order for this mechanism to work. But, Machida describes the impingement of the "laser beam" on the wire or conductor, not the absorption of the beam by the plastic or dielectric surrounding the wire or fiber. This means the plastic or dielectric must be transparent to the wavelength of light acting on the plastic. If the mechanism is to be effective, the wire or conductor should react in time to interrupt the laser before energy can escape and harm the patient, user, or instrumentation. Thus, the wire or conductor should be a material that melts at a low temperature. However, fabrication concerns for the embodiment in which the conductor is within the plastic limit the melting point of the conductor to a temperature above the processing temperature of the plastic. These concerns appear to be mutually exclusive and render this aspect of Machida unworkable in practice. The materials used as examples in Machida include copper wire, and gold or copper coated on the fiber. Such wire has a very high melting point and will not be effective until the structure reaches the melting point of copper. By then, the damage to the patient will already have been done.

Consider the second mechanism in Machida, melting the dielectric. This embodiment requires a conductor disposed on the optical fiber within the polymer and a conductor circumferentially outside the polymer. Should a break occur, this structure requires melting of the dielectric (because the melting point of the conductor is too high) resulting in shorting of the conductors. When this occurs, conditions would have to be such that the heat and subsequent temperature rise generated by the "leakage of the laser beam" was lower than the melting point of the conductor itself and above the melting point of the dielectric. In addition some mechanism would be needed to insure the shorting of the inner and outer conductors. None is described. Further if the temperature was above the melting point of the dielectric and above the degradation temperature of the dielectric, continuity between the two conductors would be highly improbable.

Consider the third mechanism, heating of a wire and the sensing temperature by sensing change in current. In this embodiment a temperature sensitive conductor is disposed within or on the fiber plastic. When a break occurs, and when laser energy is present, the resultant leak of energy causes an increase in the temperature. This would be detected by the temperature-sensitive wire and would provide an electrical signal proportional to the temperature. As an example, Machida describes nichrome wire. He discusses ". . .slight leakage of the laser beam . . .be perceived by the wire. . ." Such an example would require sensitive electronics to be employed if the sensing were to be limited to either slight leakage or a small temperature rise in the fiber optic or surrounding plastic. In addition, changes in either the local or ambient temperature could cause confusing or false interpretation of the signals obtained from this embodiment.

The present invention, in contrast, provides a simple yet effective solution to these problems.

SUMMARY OF THE INVENTION

In its broadest form, the invention is directed to apparatus for detecting a break in an optical fiber adapted for carrying optical energy such as laser energy. The apparatus comprises an optical fiber having a core, cladding means concentric with and surrounding the core and sheath means concentric with and surrounding the cladding means. Detector means are located within the sheath means and have a portion thereof contiguous the cladding means. The detector means is adapted to detect both a break in the portion contiguous the cladding means as a result of a break in the fiber and a change in transmission of optical energy resulting from a break in the fiber without a concomitant break in the contiguous portion and to provide a signal indicative of a break in the fiber.

More particularly, the invention is directed to apparatus for detecting a break in an optical fiber adapted for carrying optical energy such as laser energy, and comprises an optical fiber having a core, cladding means concentric with and surrounding the core and sheath means concentric with and surrounding the cladding means; a conductive polymer in the sheath means, the polymer having at least one characteristic which changes in response to absorption of optical energy of the type carried by the fiber; monitoring means for monitoring both a physical break in the conductive polymer as a result of a break in the fiber and a change in said at least one characteristic due to impingement of optical energy on the conductive polymer resulting from a break in the fiber without a concomitant break in the conductive polymer; and signalling means responsive to the monitoring means for providing a signal indicative of a break in the fiber.

Further, the invention is directed to apparatus for detecting a break in an optical fiber adapted for carrying optical energy such as laser energy, and comprises an optical fiber, first optical detector means adjacent the distal end of the fiber, second optical detector means adjacent the proximal end of the fiber, and comparison means for comparing the outputs of the first and second optical detectors and for generating a signal indicative of normal operation and a signal indicative of a break in the fiber.

Still further, the invention is directed to apparatus for detecting a break in an optical fiber adapted for carrying optical energy such as laser energy, and comprises a primary optical conductor for carrying the laser energy to a point of use, a secondary optical conductor disposed adjacent the primary optical conductor, the distal end of the secondary optical conductor being adjacent the distal end of the primary optical conductor and being substantially reflective, a source of secondary optical energy adjacent the proximal end of the secondary optical conductor for inputting optical energy into the secondary optical conductor, optical detector means adjacent the proximal end of the secondary optical conductor for detecting optical energy reflected from the distal end of the secondary optical conductor, and comparison means for comparing the output of the optical detector means to a predetermined reference and generating a signal indicative of normal operation and a signal indicative of a break in the fiber.

DESCRIPTION OF THE DRAWINGS

For the purpose of illustrating the invention, there is shown in the drawings forms which are presently preferred; it being understood, however, that this invention is not limited to the precise arrangements and instrumentalities shown.

FIG. 3 is a diagrammatic view illustrating an embodiment of the invention utilizing electro-optic detectors as the sensing elements.

FIG. 4 is a diagrammatic view illustrating an embodiment of the invention utilizing optical means for detecting a break in the fiber.

DETAILED DESCRIPTION

Figure 1:
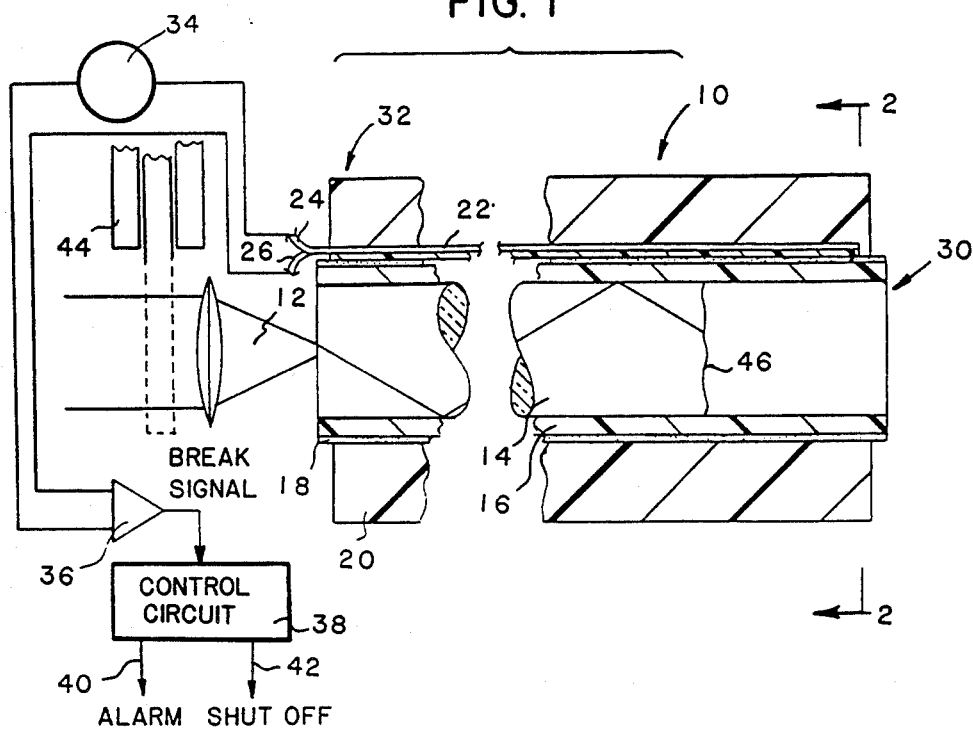
FIG. 1 is a diagrammatic view illustrating an embodiment of the invention utilizing an electrical conductor as the means for monitoring a break in the fiber.

The present invention covers three broad categories of detecting a break in an optical fiber. The first category of break detection is primarily mechanical in nature and relies on an electrical conductor as the means for sensing a break in the optical fiber. A typical optical fiber comprises a core which carries the optical energy from a source to a point of use, a cladding concentric with the core and a "strength member" or sheath concentric with the core and the cladding. In addition, a typical optical fiber will also have a thin polymer membrane between the cladding and the sheath. Optical fibers are, of course, well-known and need not be described in great detail here. The first category of detection provides for the electrical detection of a break in an optical fiber by mechanical forces caused by either a direct break in the optical fiber with a concomitant break in the electrical conductor (which can indicate a break in the fiber with or without radiant energy present in the fiber) or by a break in the optical conductor, with radiant energy present, resulting in a thermally-induced mechanical break in the conductor.

The second category of break detection can be described as electro-optic detection. In this category, an optical detector is placed at the distal end of the optical fiber. (As used herein, the term "optical" refers to the portion of the electromagnetic spectrum from infrared through ultraviolet, and is not intended to imply any limitation on frequency or wavelength.) This distal end detector provides an electrical signal proportional to the optical energy normally transmitted through the fiber. The optical detector responds to normal scatter of optical energy out of the optical fiber. A second optical detector may, but need not, be placed at the proximal end of the optical fiber. A break in the optical fiber will interrupt the normal scatter sensed by the distal optical detector, causing a change in its output. The distal end detector output is compared to either a fixed reference or, where a proximal detector is used, to the output of the proximal detector. A change in the relationship between the output of the distal detector and either the fixed reference or output of the proximal detector indicates a leak of optical radiation from the optical fiber as a result of the break in the optical fiber.

The third category of break detection can be referred to as optical detection. In this category, the optical fiber comprises a secondary optical conductor disposed adjacent or concentric with the primary optical conductor, or core, used to carry the laser energy from the source to a point use. The secondary optical conductor has a low melting point compared to the first optical conductor and is provided with a substantially reflective surface at its distal end. A second, separate source of optical radiation, distinguishably different from the laser radiation being carried by the primary optical conductor, is fed into the secondary optical conductor. The optical radiation input to the secondary optical conductor is reflected from the substantially reflective distal end of the secondary optical conductor and the reflected radiation is sensed by an optical detector at the input end of the secondary optical conductor. A break in both the primary optical and secondary optical conductors, resulting in a physical destruction of the secondary optical conductor, will cause a decrease in the reflected light to the optical detector, indicating a break in the optical fiber. If the primary optical conductor breaks but the secondary optical conductor does not, energy scattered from the break in the primary optical conductor will be converted into heat, causing thermally-induced damage to the secondary optical conductor, resulting in a reduction or cessation of reflected light to the optical detector, again indicating a break in the optical fiber.

In any of the embodiments of the invention, the detector outputs can be processed to yield a signal which can be used to provide either a visible or audible break indication to the surgeon or, alternatively, can be used to automatically terminate input of optical energy to the optical fiber, such as by activating a shutter or interrupting power to the laser, without intervention of the surgeon.

Referring now to the drawings, wherein like numerals indicate like elements, there is shown in FIG. 1 an optical fiber 10 for carrying radiant energy 12 from a source such as a laser (not shown) to a point of use. Optical fiber 10 comprises an optical conductor, or core, 14 contained within a concentric cladding 16, in conventional fashion. Core 14 and cladding 16 are contained within a thin polymeric layer 18 overlaid by a strengthening polymer, or sheath, 20. This much of the construction of optical fiber 10 is conventional and well understood by those skilled in the art.

Figure 2:
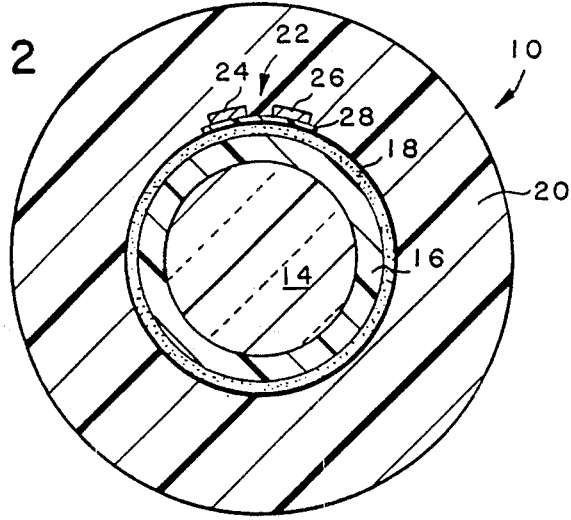
FIG. 2 is a sectional view taken along the lines 2—2 of FIG. 1.

As seen in both FIGS. 1 and 2, within sheath 20 is located a thin electrical conductor 22 disposed directly on or closely adjacent polymeric layer 18 of optical fiber 10. Electrical conductor 22 is preferably in the form of a pair of conductive traces 24 and 26 deposited on a thin substrate 28 of a non-conductive polymeric material such as Mylar (Trademark). Traces 24 and 26 are connected together near distal end 30 of optical fiber 10 to form a closed loop. Electrical continuity of traces 24 and 26 can be detected at the proximal end 32 of optical fiber 10. For that purpose, a source 34 of electrical signals is connected to the proximal ends of traces 24 and 26 through a continuity detector 36. The output of continuity detector 36 can be caused to change as a result of a break in continuity between traces 24 and 26 due to a break in fiber 10. The change in output of continuity detector 36 comprises a break signal. This break signal can be sent to a control circuit 38, as shown in FIG. 1. The control circuit can then generate either an alarm signal 40 which can be used to actuate an audible or visible alarm, or a shut off signal 42 which can be used to automatically terminate the input of optical energy 12 into fiber 10. Shut off signal 42 can be used to close a shutter 44, as indicated in FIG. 1, or can be used to terminate power to the laser itself. The control circuit can be designed to selectably generate either alarm signal 40, shut off signal 42 or both.

As those skilled in the art will recognize, it is important that the response time of the break detector be very fast, so that energy input to a broken fiber can be terminated before damage is done to the patient. In addition, it is desirable to be able to determine whether or not an optical fiber has a break therein before feeding high energy optical radiation into the fiber. These objectives are achieved in the present invention by making conductive traces 24 and 26 in the form of a thin film conductor fabricated by vacuum deposition or other film metallization techniques laid down on a Mylar (Trademark) or other suitable substrate. Preferably, however, conductive traces 24 and 26 are fabricated from either thermoplastic or thermoset conductive inks containing metallic particles. The selection criteria for the particular material for conductor traces 24 and 26 must include consideration of electrical impedance, elongation characteristics and fabricating and operating temperatures.

The determination of the acceptable electrical impedance is based on the length of the optical fiber and the electronic detection scheme used. Typically, a resistive impedance of less than 10,000 ohms is easily detectable and is therefore preferred. An impedance of several hundred thousand ohms can be detected using standard electronic devices, greater impedances (on the order of several megohms) being more costly and impractical.

The tensile strength, or percent elongation, of the conductive traces is also an important variable. This parameter determines the sensitivity of the detector to functional features such as severity of the break in the optical fiber and the bend radius. A conductor with a very low percent elongation (for example, in the range 0.05 to 1.0%) will be very responsive to microfractures in the optical fiber and to severe bends. In contrast, a high percent elongation material (for example, in the range of 1 to 5%) will be forgiving of microfractures and excessive bends, but can still be designed to break when the optical fiber is broken. For a brittle optical fiber, such as those made from group 1a halides, a conductor with a low percent elongation is required. In contrast, for optical fibers made from group 1b halides, a higher percent elongation conductor would be acceptable without limiting the functional bend radius or elongation of the fiber.

There are two major concerns related to temperature. The first has to do with the temperature the optical fiber will experience during fabrication and processing. Most optical fibers have a sheath 20 made of a fluoropolymer such as Tefzel (Trademark). In this instance, processing temperatures on the order of 600° F. are encountered. When fabricating an optical fiber including conductive traces 24 and 26, the material of conductive traces 24 and 26 must therefore be able to withstand temperatures of 600° F. without damage. The second concern has to do with the local and ambient temperature to which the optical fiber will be exposed in use. In laser surgery, local temperatures near the tip of the fiber may be several hundred degrees Fahrenheit, depending on the proximity of the fiber to the thermally-treated area. In other applications, such as industrial sensing, ambient temperatures may exceed 400° F.

Because the conductive traces 24 and 26 must withstand such high processing and operating temperatures, the optical break detector cannot rely on melting of the conductive traces. Instead, the continuity of conductive traces 24 and 26 must be broken as a result of a mechanical separation. Mechanical separation of conductive traces 24 and 26 can be caused either directly as a result of a break in the fiber and a concomitant break in the conductive traces, or indirectly, as a result of a break in the optical fiber without a concomitant break in conductive traces 24 and 26. In the second instance, optical radiation will be reflected from the interface 46 in core 14 (see FIG. 1) caused by a break in the fiber. The radiation will be reflected from interface 46 into sheath 20 causing a very rapid temperature rise in sheath 20 and a very rapid temperature rise in the substrate 28 on which are located conductive traces 24 and 26. This rapid expansion will generate mechanical forces acting on conductor 22 and substrate 28, resulting in a thermally-induced mechanical separation of conductive traces 24 and 26.

Since conductive traces 24 and 26 depend on a physical separation as a result of the direct application of mechanical forces or a thermally-induced mechanical break, a break in optical fiber 10 can be detected in the first instance whether or not optical energy is being supplied to optical fiber 10. This enables a surgeon to check an optical fiber for breaks before inputting potentially harmful high energy optical radiation into the fiber.

Referring now to FIG. 3, the second embodiment of the invention will be described. In the embodiment of FIG. 3, an optical detector 48 is placed at the distal end 30 of optical fiber 10, within sheath 20 or, if the sheath is sufficiently transparent to the optical energy being carried by fiber 10, just outside sheath 20. Due to the normal scatter of optical energy out of core 10, optical detector 48 provides an electrical output signal proportional to the optical energy transmitted through fiber 10. The output signal from distal detector 48 can be compared in a comparison circuit 50 to either a fixed reference representative of the input radiant energy 12 or, as shown in FIG. 3, to the output of a second, proximal, optical detector 52 located at the proximal end of optical fiber 10. As will be understood, the electrical output signal of proximal detector 52 will be proportional to the optical energy being input to optical fiber 10. The output of comparison circuit 50 can be made to be at a first voltage when the optical fiber 10 is operating properly. When a break occurs in fiber 10, the transmissivity instantaneously drops, causing a change in the output of distal detector 48. When the output of distal detector 48 changes, comparison circuit 50 can be made to output a second voltage indicating that a break has occurred. This break signal can be sent to a control circuit 38, as in the first embodiment.

Referring now to FIG. 4, a third embodiment is illustrated. In FIG. 4, optical fiber 10 comprises a secondary optical conductor 54 adjacently or, preferably, concentrically disposed around core 14 of optical fiber 10. The distal end 56 of secondary optical conductor 54 is made substantially reflective by any of several means, including reflective paint applied to its end surface or by vacuum deposition of a reflective metal such as gold, silver or the like onto such surface. A source 58 of secondary optical energy, distinguishably different from the high energy optical radiation 12, is disposed adjacent the proximal end 60 of secondary optical conductor 54. The secondary optical energy will travel along secondary optical conductor 54 to the distal end 56 and be reflected back to the proximal end, where the reflected energy is detected by an optical detector 62 located adjacent the proximal end 60 of secondary optical conductor 54 and diametrically opposite source 58. The output of optical detector 62 is sent to a comparison circuit 64, where it is compared to a fixed reference voltage 66.

Should a break in fiber 10 occur, optical energy scattered from the break will be rapidly converted into heat by sheath 20, causing damage to secondary optical conductor 54, resulting in a reduction or cessation of reflected energy to detector 62. This change is sensed by comparison circuit 64 and the output of circuit 54 is a break signal indicative of a break in fiber 10. The break signal can be sent to control circuit, as with the first two embodiments.

It should be noted that this embodiment, like the first, can detect a break in the fiber 10 without inputting high energy radiation 12 if a break in core 10 also results in a break in secondary optical conductor 54.

The present invention may be embodied in other specific forms without departing from the spirit or essential attributes thereof and, accordingly, reference should be made to the appended claims, rather than to the foregoing specification, as indicating the scope of the invention.

We claim:

1. Apparatus for detecting a break in an optical fiber adapted for carrying optical energy such as laser energy, comprising:
    an optical fiber having a core, cladding means concentric with and surrounding the core and sheath means concentric with and surrounding the cladding means,
    detector means within said sheath means and having a portion thereof contiguous the cladding means, the detector means being adapted to detector both (1) a break in the portion contiguous the cladding means as a result of a break in the fiber independent of optical energy in the fiber and (2) a change in transmission of optical energy resulting from a break in the fiber without concomitant break in said portion, the detector means providing a break signal indicative of a break in the fiber.

2. Apparatus according to claim 1, further comprising control means responsive to the break signal for preventing further input of optical energy to the fiber after a break in the fiber is detected.

3. Apparatus according to claim 1, further comprising means responsive to the break signal for generating an operator-detectable indication of a break in the fiber after a break is detected.

4. Apparatus according to claim 1, wherein the detector means comprises an electrical conductor.

5. Apparatus according to claim 4, wherein the electrical conductor comprises a conductive ink.

6. Apparatus according to claim 5, wherein the conductive ink is from the group comprising thermoplastic conductive polymers and thermosetting conductive polymers.

7. Apparatus for detecting a break in an optical fiber adapted for carrying optical energy such as laser energy, comprising:
    an optical fiber having a core, cladding means concentric with and surrounding the core and sheath means concentric with and surrounding the cladding means,
    a conductive polymer in the sheath means, the polymer having at least one characteristic which changes in response to absorption of optical energy of the type carried by the fiber,
    monitoring means for monitoring both (1) a physical break in the conductive polymer as a result of a break in the fiber independent of optical energy in the fiber and (2) a change in said at least one characteristic due to impingement of optical energy on the conductive polymer resulting from a break in the fiber without a concomitant break in the conductive polymer, and
    signalling means responsive to the monitoring means for providing a break signal indicative of a break in the fiber.

8. Apparatus according to claim 7, further comprising control means responsive to the break signal for preventing further input of optical energy to the fiber after a break in the fiber is detected.

9. Apparatus according to claim 7, further comprising means responsive to the break signal for generating an operator-detectable indication of a break in the fiber after a break is detected.

10. Apparatus for detecting a break in an optical fiber adapted for carrying optical energy such as laser energy, comprising:
    an optical fiber,
    first optical detector means adjacent one end of the fiber,
    second optical detector means adjacent the other end of the fiber, and
    comparison means for comparing the outputs of the first and second optical detectors and for generating a signal indicative of normal operation and a signal indicative of a break in the fiber independent of the intensity of the optical energy in the fiber and independent of the environment in which the fiber is located.

11. Apparatus according to claim 10, further comprising control means responsive to the break signal for preventing further input of optical energy to the fiber after a break in the fiber is detected.

12. Apparatus according to claim 10, further comprising means responsive to the break signal for generating an operator-detectable indication of a break in the fiber after a break is detected.

13. Apparatus for detecting a break in an optical fiber adapted for carrying optical energy such as laser energy, comprising:

an optical fiber having a primary optical conductor for carrying the laser energy to a point of use and a secondary optical conductor disposed adjacent the primary optical conductor, one end of the secondary optical conductor being adjacent a first end of the primary optical conductor and being substantially reflective, a source of secondary optical energy adjacent the other end of the secondary optical conductor for inputting optical energy into the secondary conductor, optical detector means adjacent the other end of the secondary optical conductor for detecting optical energy reflected from the one end of the secondary conductor, and comparison means for comparing the output of the optical detector means to a predetermined reference and generating a signal indicative of normal operation and a break signal indicative of a break in the fiber independent of the intensity of the laser energy in the fiber and independent of the environment in which the fiber is located.

14. Apparatus according to claim 13, further comprising control means responsive to the break signal for preventing further input of optical energy to the fiber after a break in the fiber is detected.

15. Apparatus according to claim 13, further comprising means responsive to the break signal for generating an operator-detectable indication of a break in the fiber after a break is detected.

* * * * *